United States Patent
Sweeny et al.

(10) Patent No.: US 10,061,564 B2
(45) Date of Patent: *Aug. 28, 2018

(54) INJECTING CPU TIME JITTER TO IMPROVE ENTROPY QUALITY FOR RANDOM NUMBER GENERATOR

(71) Applicant: INTERNATIONAL BUSINESS MACHINES CORPORATION, Armonk, NY (US)

(72) Inventors: James W. Sweeny, Poughkeepsie, NY (US); Tamas Visegrady, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/808,929

(22) Filed: Nov. 10, 2017

(65) Prior Publication Data

US 2018/0067726 A1 Mar. 8, 2018

Related U.S. Application Data

(63) Continuation of application No. 15/198,043, filed on Jun. 30, 2016, now Pat. No. 9,891,889.

(51) Int. Cl.
*G06F 7/58* (2006.01)
*H03K 3/84* (2006.01)

(52) U.S. Cl.
CPC ............. *G06F 7/588* (2013.01); *H03K 3/84* (2013.01)

(58) Field of Classification Search
None
See application file for complete search history.

(56) References Cited

U.S. PATENT DOCUMENTS

| | | | | |
|---|---|---|---|---|
| 9,720,650 B2 * | 8/2017 | Lewis | ..................... | G06F 7/588 |
| 2006/0069706 A1 * | 3/2006 | Lazich | ..................... | G06F 7/588 |
| | | | | 708/251 |

(Continued)

OTHER PUBLICATIONS

List of IBM Patents or Patent Applications Treated as Related; (Appendix P), Date Filed Nov. 10, 2017; 2 pages.

(Continued)

*Primary Examiner* — Michael D. Yaary
(74) *Attorney, Agent, or Firm* — Cantor Colburn LLP (57) ABSTRACT

Aspects of present disclosure relate to random number generator, a method and a computer program product of improving entropy quality of the random number generator. The method may include: receiving, at an input/output interface module of the random number generator, a request to generate a random number having a predetermined number of random bits, and starting a random bit generating loop to generate each of the random bits of the random number to be generated. In certain embodiments, random bit generating loop may include: incorporating a CPU Time as a randomness factor in generating random number to improve entropy quality, including non-deterministic memory-subsystem latencies in entropy extraction, such as those introduced by unpredictable cache movements, generating a Candidate Bit by using a Clock Time, and generating a random bit for random number by using a von Neumann unbiasing analysis module, until every random bits of the random number is generated.

20 Claims, 3 Drawing Sheets

(56) References Cited

U.S. PATENT DOCUMENTS

| | | | | |
|---|---|---|---|---|
| 2007/0230694 A1* | 10/2007 | Rose | ............ | G06F 7/58 |
| | | | | 380/46 |
| 2010/0005128 A1* | 1/2010 | Ergun | ............ | G06F 7/58 |
| | | | | 708/251 |
| 2014/0280413 A1* | 9/2014 | Lewis | ............ | G06F 7/588 |
| | | | | 708/251 |
| 2015/0178048 A1* | 6/2015 | Burleson | ............ | G06F 7/588 |
| | | | | 708/255 |

OTHER PUBLICATIONS

Sweeny, James W., Pending Application entitled: "Injecting CPU Time Jitter to Improve Entropy Quality for Random Number Generator" U.S. Appl. No. 15/198,043; filed with the U.S. Patent and Trademark Office on Jun. 30, 2016.

* cited by examiner

INJECTING CPU TIME JITTER TO IMPROVE ENTROPY QUALITY FOR RANDOM NUMBER GENERATOR

DOMESTIC PRIORITY

This application is a continuation application of the legally related U.S. Ser. No. 15/198,043 filed Jun. 30, 2016, the contents of which are incorporated by reference herein in their entirety.

BACKGROUND

The present disclosure relates generally to random number generation, and more particularly to methods for improving the entropy quality of a random number generator by injecting central processing unit (CPU) time jitter.

Secure cryptography is dependent on the ability to generate unpredictable random numbers. Thus, all cryptographic modules (hardware or software based) must have access to a high-quality random number generator (RNG), sometimes called a random bit generator (RBG). There are two classes of RNG: (1) a true random number generator (TRNG), sometimes called a non-deterministic random number generator (NDRNG); and (2) a pseudo-random number generator (PRNG), sometimes called the deterministic random number generator (DRNG). A true random number generator (TRNG) is a genuine random number generator. It extracts entropy from one or more noise sources and compresses it into a stream of random bytes. For hardware-based cryptographic modules, the TRNG noise sources are hardware features built into the device, such as sampling thermal noise from a resistor. Software based cryptographic module TRNGs tend to have fewer available noise sources. A pseudo-random number generator (PRNG) takes a seed as input and produces a stream of output that looks random, but is actually not random at all (hence the name 'deterministic'). In a well-designed PRNG, the output is indistinguishable from random provided the seed is random and kept secret. PRNGs also have a much higher throughput than TRNGs. Thus, a PRNG is usually seeded from a separate TRNG, then used as the RNG for the module.

Conventionally, random number generators use real clock time or CPU time as a randomness factor to generate random numbers. Conventional random number generators use a loop to get a time value, calculate a time difference, update the time value, select a lower order bit of the time delta as a candidate bit, and perform a von Neumann analysis to generate a random bit. Note that if the loop always executed at a constant rate, the algorithm would loop forever, since the candidate bit would always be the same. Naturally occurring jitter is a phenomenon of all computing systems. Hardware and operating systems are constantly servicing events that happen beneath the visibility of a virtual program. Page faults, I/O completion interrupts, level 1 (L1) cache misses, etc. are examples of such events, all of which add jitter to any executing program loop. If you consider a software based TRNG running as a virtual program, naturally occurring jitter is beyond the TRNG's control and, thus, unpredictable. With the continued drop in computing hardware prices, today's computing systems are more highly tuned than in the past. The availability of more RAM and larger L1 caches results in less interruptions. Hence, naturally occurring jitter is becoming scare. It is desirable to add a new randomness factor into the random number generator.

Therefore, heretofore unaddressed needs still exist in the art to address the aforementioned deficiencies and inadequacies.

SUMMARY

In one aspect, the present disclosure relates to a random number generator using CPU time jitter to improve entropy quality of a random number generator. In certain embodiments, the random number generator may include: an input/output interface module, a CPU Time extraction module, a Clock Time extraction module, a jitter collection module and a von Neumann unbiasing analysis module. The input/output interface module may receive, from a requester, a request to generate a random number having a predetermined number of random bits, initiate a random bit generating loop to generate each of the random bits, and transmit the random number generated to the requester. The CPU Time extraction module may extract a CPU Time from a CPU clock of a CPU of a computer. The Clock Time extraction module may extract a Clock Time from the CPU clock. The jitter collection module submodule configured to accumulate non-predictable time differences by observing the latency of multiple operations and induce cache-related non-determinism by purging CPU cache. The von Neumann unbiasing analysis module may perform a von Neumann unbiasing analysis to generate the random bits for each of the random numbers to be generated.

In another aspect, the present disclosure relates to a method of injecting CPU time jitter to improve entropy quality of a random number generator. In certain embodiments, the method may include: receiving, at an input/output interface module of the random number generator, a request to generate a random number having a predetermined number of random bits, and starting a random bit generating loop to generate each of the random bits of the random number to be generated. In certain embodiments, the random bit generating loop may include: incorporating a CPU Time as a randomness factor in generating random number to improve entropy quality of the random number generator, generating a Candidate Bit by using a Clock Time, and generating a random bit for the random number by using a von Neumann unbiasing analysis module, until every random bit of the random number is generated.

In yet another aspect, the present disclosure relates to a computer program product operable on a CPU of a computer. In certain embodiments, the computer program product may include a non-transitory computer readable storage medium storing computer executable instructions. When these computer executable instructions are executed by the CPU, these computer executable instructions cause the CPU to perform: receiving, at an input/output interface module of the random number generator, a request to generate a random number having a predetermined number of random bits, and initiating a random bit generating loop to generate each random bit of the random number to be generated. The random bit generating loop may include: incorporating a CPU Time as a randomness factor in generating random number to improve entropy quality of the random number generator, generating a Candidate Bit by using a Clock Time, and generating a random bit for the random number by using a von Neumann unbiasing analysis module, until every random bit of the random number is generated.

These and other aspects of the present disclosure will become apparent from the following description of the preferred embodiment taken in conjunction with the following drawings and their captions, although variations and modifications therein may be affected without departing from the spirit and scope of the novel concepts of the present disclosure.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

The present disclosure is more particularly described in the following examples that are intended as illustrative only because numerous modifications and variations therein will be apparent to those skilled in the art. Various embodiments of the invention are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the present disclosure, and in the specific context where each term is used. Certain terms that are used to describe the present disclosure are discussed below, or elsewhere in the specification, to provide additional guidance to the practitioner regarding the description of the present disclosure. It will be appreciated that same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the present disclosure or of any exemplified term. Likewise, the present disclosure is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "plurality" means two or more. The terms "comprising," "including," "carrying," "having," "containing," "involving," and the like are to be understood to be open-ended, i.e., to mean including but not limited to.

The term computer program, as used above, may include software, firmware, and/or microcode, and may refer to programs, routines, functions, classes, and/or objects. The term shared, as used above, means that some or all code from multiple modules may be executed using a single (shared) processor.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The present disclosure will now be described more fully hereinafter with reference to the accompanying drawings FIGS. 1-3, in which certain exemplary embodiments of the present disclosure are shown. The present disclosure may, however, be embodied in many different forms and should not be construed as limited to the embodiments set forth herein; rather, these embodiments are provided so that this invention will be thorough and complete, and will fully convey the scope of the invention to those skilled in the art.

Figure 1:
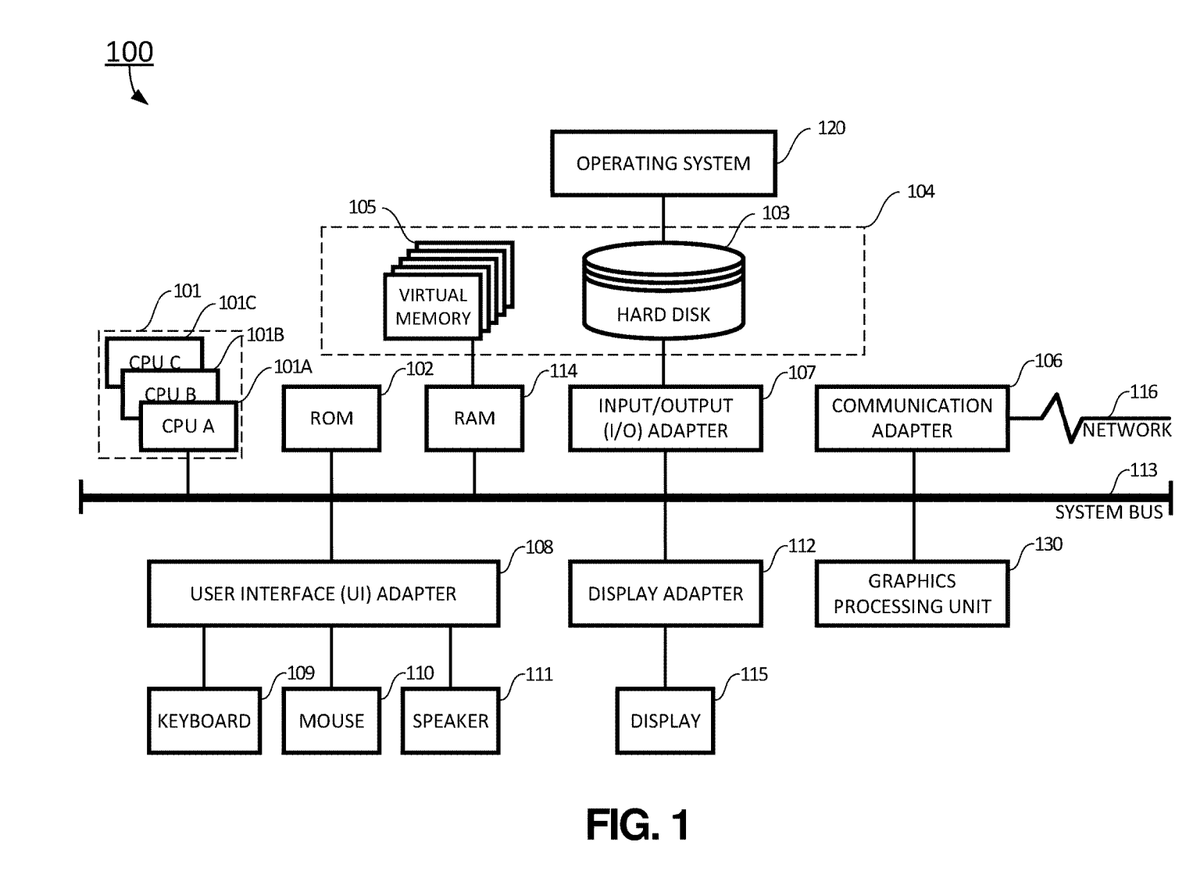
FIG. 1 is a block diagram illustrating an exemplary computer system for injecting CPU time jitter to improve entropy quality of a random number generator according to certain embodiments of the present disclosure.

Referring to FIG. 1, an embodiment of a computer system 100 for injecting CPU time jitter to improve entropy quality of a random number generator and implementing the teachings herein. In this embodiment, the computer system 100 has one or more processors 101A, 101B, 101C, etc. (collectively or generically referred to as processor(s) 101). In one embodiment, each processor 101 may include a reduced instruction set computer (RISC) microprocessor. Processors 101 are coupled to a system memory 114 and various other components via a system bus 113. Read only memory (ROM) 102 is coupled to the system bus 113 and may include a basic input/output system (BIOS), which controls certain basic functions of the computer system 100.

FIG. 1 further depicts an input/output (I/O) adapter 107 and a communication adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and virtual memory device 105 are collectively referred to herein as mass storage 104. An operating system 120 for execution on the computer system 100 may be stored in mass storage 104. The communication adapter 106 interconnects bus 113 with an outside network 116 enabling the computer system 100 to communicate with other such systems. A screen (e.g., a display monitor) 115 is connected to system bus 113 by a display adaptor 112, which may include a graphics adapter to improve the performance of graphics intensive applications and a video controller. In one embodiment, the I/O adapters 107, the communication adapter 106, and the display adapter 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and the display adapter 112. A keyboard 109, a mouse 110, and one or more speakers 111 all interconnected to bus 113 via user interface adapter 108, which may include, for example, a Super I/O chip integrating multiple device adapters into a single integrated circuit.

In exemplary embodiments, the computer system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing and has a highly parallel structure that makes it more effective than general-purpose CPUs for algorithms where processing of large blocks of data is done in parallel.

Thus, as configured in FIG. 1, the computer system 100 includes processing capability in the form of processors 101, storage capability including the system memory 114 and mass storage 104, input means such as the keyboard 109 and the mouse 110, and the output capability including the one or more speakers 111 and display 115. In one embodiment, a portion of the system memory 114 and mass storage 104 collectively store the operating system 120 to coordinate the functions of the various components shown in FIG. 1. In certain embodiments, the network 116 may include symmetric multiprocessing (SMP) bus, a Peripheral Component Interconnect (PCI) bus, local area network (LAN), wide area network (WAN), telecommunication network, wireless communication network, and the Internet.

Figure 2:
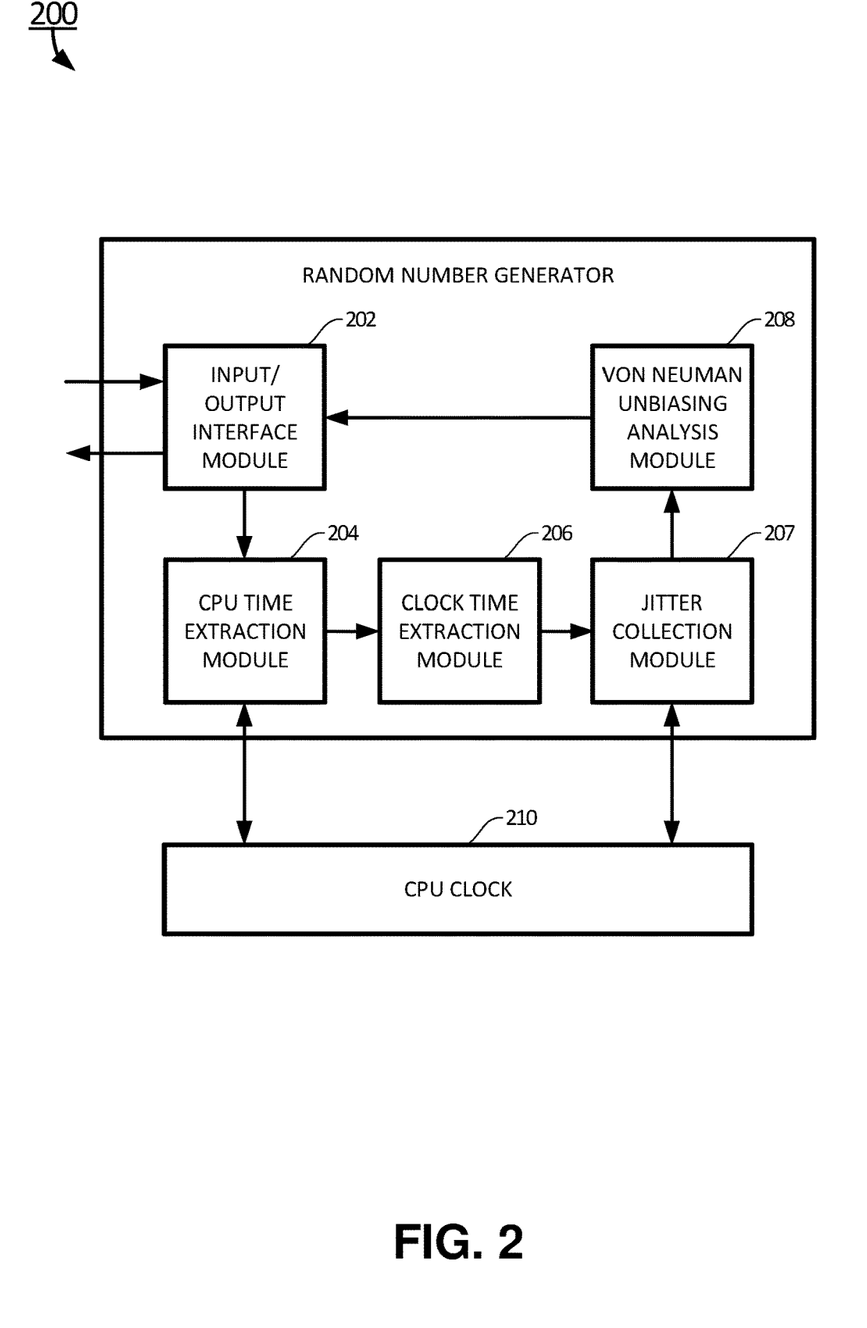
FIG. 2 is a block diagram of a random number generator using CPU time jitter as a randomness factor according to certain embodiments of the present disclosure.

In one aspect, the present disclosure relates to a random number generator 200 using CPU time jitter to improve its entropy quality, as shown in FIG. 2. In certain embodiments, the random number generator 200 may include: an input/output interface module 202, a CPU_Time extraction module 204, a Clock_Time extraction module 206, a jitter collection module 207 and a von Neumann unbiasing analysis module 208.

In certain embodiments, the input/output interface module 202 may receive, from a requester, a request to generate a random number having a predetermined number of random bits, initiate a random bit generating loop to generate each of the random bits, and transmit the random number generated to the requester. In certain embodiments, the length of the predetermined number of random bits are determined by the applications of the random number to be generated, and it may include 64 bits, 128 bits, 256 bits, or any other commonly used lengths.

In certain embodiments, Clock_Time may be a real time clock, which measures elapsed real time. The CPU_Time is an accumulator that measures how busy a CPU is. When the CPU is kept 100% busy, then both Clock_Time and CPU_Time values would tick at the same rate. However, the CPU is rarely 100% busy since it has to wait for events so that it can proceed. Both Clock_Time and CPU_time values are maintained by the CPU but are independent. For example, given two points in time (say the beginning and ending of a loop iteration), the elapsed real time may have been 50 ms (Clock_Time), but when the CPU was only busy 50% of that time, the CPU_time would only be 25 ms. Therefore, an additional randomness factor, i.e., CPU jitter, is introduced into the random number generator 200 here to increase and/or improve an entropy quality of the random number generator 200 according to certain embodiments of the present disclosure.

In certain embodiments, the CPU_Time extraction module 204 may extract a CPU_Time from a CPU clock 210 of a CPU of a computer for every random bit of the random number to be generated during the random bit generation loop. In certain embodiments, the CPU_Time extraction module 204 of the random number generator 200 may perform following pseudo-code:

```
Set CPU_Time = extracted CPU_Time;
When CPU_Time MODULO 3 = 0 Then
    Purge the L1 cache entry holding a time_value.
```

The pseudo-code represents how CPU_Time is used to improve and/or increase the entropy quality of the random number generator 200. In certain embodiments, the CPU_ime extraction module 204 may include: retrieving a CPU_Time from the CPU clock 210 of the CPU for current iteration of generating current random bit, setting CPU_Time extracted to be the CPU_Time, performing a modulo function to the CPU_Time, and purging level 1 (L1) cache of the CPU when the result of the modulo function is zero.

In certain embodiments, the extraction of the CPU_Time value produces a pseudo-random value (one that's resistant to the effects of event quantization). This value is then divided by 3 to get the remainder (MODULO 3). When the result is zero, an L1 cache entry holding Time_Value is explicitly purged. The Time_Value is then set on the next instruction causing the L1 cache entry to be filled again. This operation adds extra jitter to the random bit generation loop on average every third iteration.

In certain embodiments, the Clock_Time extraction module 206 may extract a Clock_Time from the CPU clock 210. In certain embodiments, the Clock_Time extraction module 206 of the random number generator 200 may perform following pseudo-code:

```
Read clock to get current Time_Value for current iteration;
Compute Time_Delta = current Time_Value – previous Time_Value;
Set previous Time_Value = current Time_Value;
Read Clock_Time a second time;
Save low 4 bits of Clock_Time value as Fold_Counter;
Loop Fold_Counter number of times
    Set Candidate_Bit = Candidate_Bit XORed with low-order bit of
    Time_Delta
    Bit shift Time_Delta to the right one bit
Endloop
```

The pseudo-code represents above how Clock_Time is used to improve and/or increase the entropy quality of the random number generator 200. In certain embodiments, the Clock_Time extraction module 206 of the random number generator 200 may perform: retrieving a Clock_Time from the CPU clock 210 and updating a Time_Value, calculating a Time_Delta by subtracting previous iteration Clock_Time from current Clock_Time retrieved, updating the Time_Value by replacing the previous Time_Value with current Time_Value, reading the Clock_Time a second time, and creating a Fold_Counter and generating a Candidate_Bit by using the Time_Delta calculated.

In certain embodiments, the Clock_Time extraction module 206 of the random number generator 200 may also perform: saving low four bits of the current Time_Value as the Fold_Counter, and looping Fold_Counter number of time for setting Candidate_Bit to Candidate_Bit XORed with low-order bit of Time_Delta, and bit shifting Time_Delta to the right one bit. This operation may further improve and/or increase the entropy quality of the random number generator 200. In certain embodiments, time-measurement may include operations with uncertain/unpredictable latencies, specifically infrastructure operations related to cache management, cache-content replacement, and other CPU-related operations not fully predictable to software observing them. In certain embodiments, certain similar low-level operations may be included to increase the entropy quality of the random number generator 200. These low-level operations may not be as obvious as time-measurement or L1 cache replacement, but their impact is usually observable.

In certain embodiments, the jitter collection module 207 is configured to accumulate non-predictable time differences by observing the latency of multiple operations and induce cache-related non-determinism by purging CPU cache. With virtualization in computer systems where basically all kinds of events may be fake/software-emulated, practically usable jitter is becoming scarce. Since most time-related jitter extraction is based on the uncertainty+variation of "unpredictable" events, when these are virtualized, jitter either disappears completely, or becomes regular. This pretty much applies to all area of computing. For example: with interrupt quantization, even interrupt-arrival and processing becomes highly regular, as interrupts are no longer truly asynchronous. These interrupts are gated/quantized/entirely faked by virtual machine (VM) code.

Cache timing is important for injecting CPU_Time jitter. Cache movements, and information derived from the cache movements, remain basically-unpredictable even under virtualization environment, since they include noise of the virtual machine as a side effect. Interactions with events forcing these cache movements may stir the system state in a portable way, and virtual machine may not easily bypass/quantize/emulate these events. This is why cache-event extraction, and to some extent active contribution to cache-based traffic, is highly relevant to jitter collection.

In certain embodiments, the von Neumann unbiasing analysis module 208 may perform a von Neumann unbiasing analysis to generate the random bits for each of the random numbers to be generated. In certain embodiments, the von Neumann unbiasing analysis module 208 of the random number generator 200 may perform following pseudo-code:

Perform von Neumann unbiasing analysis;
If Candidate_Bit is not to be discarded then
    Save Candidate_Bit as a generated random bit.

The von Neumann unbiasing analysis module 208 of the random number generator 200 may perform: generating the random bit by saving the Candidate_Bit when the Candidate_Bit is not to be discarded by the von Neumann unbiasing analysis module 208.

Statistical analysis using a public domain tool called ENT confirms the method of injecting CPU_Time jitter does improve the entropy quality of the random numbers generated. A sample run of 10 million bytes collected using a conventional method without injecting CPU jitter shows the following:
  Arithmetic mean value of data bytes is 127.5262 (127.5=random).
  Monte Carlo value for Pi is 3.140686856 (error 0.03 percent).
  Serial correlation coefficient is −0.009861 (totally uncorrelated=0.0).
A sample run of 10 million bytes collected using the method of injecting CPU_Time jitter shows the following:
  Arithmetic mean value of data bytes is 127.5141 (127.5=random).
  Monte Carlo value for Pi is 3.142167657 (error 0.02 percent).
  Serial correlation coefficient is −0.002586 (totally uncorrelated=0.0).

These samples were collected from an IBM system z13 running z/OS as a z/VM guest. The method of injecting CPU_Time jitter shows improvement of entropy quality of the random generator over the conventional method.

As a specific example of non-determinism, a person having ordinary skill in the art may notice that cache-related latencies are generally not reliably predictable. As an added benefit, since processor evolution appears to steadily provide more capable, and complex, cache-management capabilities, the ability to predict cache-state transition appears to be steadily decreasing in state-of-the-art computing systems.

In another aspect, the present disclosure relates to a method of injecting CPU time jitter to improve entropy quality of a random number generator 200. In certain embodiments, the method may include: receiving, at an input/output interface module 202 of the random number generator 200, a request to generate a random number having a predetermined number of random bits, and starting a random bit generating loop to generate each of the random bits of the random number to be generated.

In certain embodiments, the random bit generating loop may include: incorporating a CPU_Time as a randomness factor in generating random number to improve entropy quality of the random number generator 200, generating a Candidate_Bit by using a Clock_Time as a second randomness factor in generating random number to improve entropy quality of the random number generator 200, and generating a random bit for the random number by using a von Neumann unbiasing analysis module 208, until every random bit of the random number is generated.

In certain embodiments, the incorporating may include: retrieving, using a CPU_Time extraction module 204 of the random number generator 200, a CPU_Time from the CPU clock 210 of the CPU of the computer, performing, using the CPU_Time extraction module 204 of the random number generator 200, a modulo function to the CPU_Time, and purging level 1 (L1) cache of the CPU when the result of the modulo function is zero. The purging may include: explicitly purging the L1 cache entry where Time_Value is stored, and setting the Time_Value on the next instruction causing the cache entry to be filled again.

In certain embodiments, the generating Candidate_Bit may include: retrieving, using a Clock-Time extraction module of the random number generator 200, a Clock_Time from the CPU clock 210, and updating a Time_Value, calculating a Time_Delta by subtracting previous iteration Clock_Time from current Clock_Time retrieved, and creating a Fold_Counter and generating Candidate_Bit by using the Time_Delta calculated. The creating may include: retrieving, using the Clock-Time extraction module of the random number generator 200, another Clock_Time from the CPU clock 210, saving, low four bits of the time value, as the Fold_Counter, and looping Fold_Counter number of time for setting Candidate_Bit to Candidate_Bit XORed with low-order bit of Time_Delta, and bit shifting Time_Delta to the right one bit.

In certain embodiments, the generating random bit may include: performing, using a von Neumann unbiasing analysis module 208, a von Neumann unbiasing analysis to generate a random bit, checking whether the random bit generated is the last bit of the random number to be generated, returning to the beginning of the random bit generating loop to generate the next random bit until the last bit of the random number to be generated is generated when the random bit generated is not the last bit of the random number to be generated, and ending the random bit generating loop and transmitting the random number generated using the input/output interface module 202 when the random bit generated is the last bit of the random number to be generated. The performing a von Neumann unbiasing analysis to generate a random bit may include: generating the random bit by saving the Candidate_Bit when the Candidate_Bit is not to be discarded by the von Neumann unbiasing analysis module 208.

Figure 3:
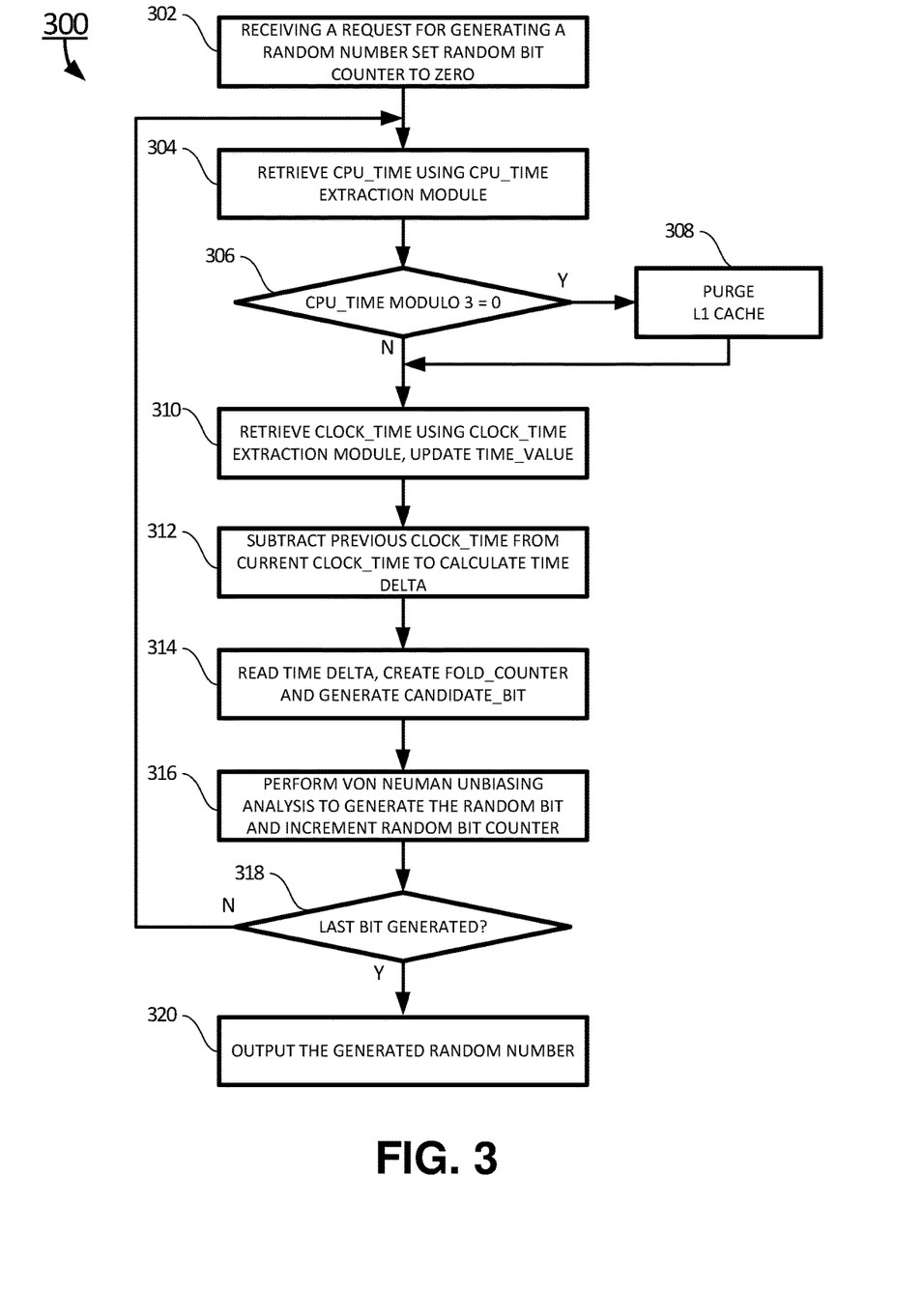
FIG. 3 is a flowchart showing a method of injecting CPU time jitter to improve entropy quality of the random number generator according to certain embodiments of the present disclosure.

Referring now to FIG. 3, a flowchart showing a method 300 of injecting CPU time jitter to improve entropy quality of the random number generator 200 is shown according to certain embodiments of the present disclosure.

At block 302, an input/output interface module 202 of a random number generator 200 may receive a request for generating a random number. The random number may include a predetermined number of random bits. In certain embodiments, the length of the predetermined number of random bits are determined by the applications of the random number to be generated, and it may include 64 bits, 128 bits, 256 bits, or any other commonly used lengths.

In certain embodiments, the random number generator 200 may initiate a random bit generation loop to generate the predetermined number of random bits for the random number. The random bit generation loop may have one iteration for each of the predetermined number of random bits. A random bit counter may be set to zero as the random bit generation loop starts.

At block 304, the random number generator 200 retrieves a CPU_Time using a CPU_Time extraction module 204 from a CPU clock 210 as shown in FIG. 2.

At block 306, the random number generator 200 performs a MODULO function to the CPU_Time retrieved. In one embodiment, the CPU_Time value is then divided by 3 to get the remainder (MODULO 3). When the MODULO result is zero, the method proceeds to block 308. When the MODULO result is not zero, the method proceeds to block 310.

At block 308, an L1 cache entry holding Time_Value is explicitly purged. The Time_Value is then set on the next instruction causing the L1 cache entry to be filled again. This operation adds extra jitter to the random bit generation loop on average every third iteration.

At block 310, the random number generator 200 may use a Clock_Time extraction module 206 to retrieve a Clock Time from the CPU clock 210.

At block 312, the random number generator 200 may calculate a Time_Delta by subtracting previous iteration Clock_Time from current Clock_Time retrieved, and updating the Time_Value by replacing the previous Time_Value with current Time_Value.

At block 314, the random number generator 200 may read the Clock_Time a second time, create a Fold_Counter and generate a Candidate_Bit by using the Time_Delta calculated.

In certain embodiments, the Clock_Time extraction module 206 of the random number generator 200 may also perform: saving low four bits of the current Time_Value as the Fold_Counter, and looping Fold_Counter number of time for setting Candidate_Bit to Candidate_Bit XORed with low-order bit of Time_Delta, and bit shifting Time_Delta to the right one bit. This operation may further improve and/or increase the entropy quality of the random number generator 200.

At block 316, the random number generator 200 may perform a von Neumann unbiasing analysis to generate the random bits for each of the random numbers to be generated using a von Neumann unbiasing analysis module 208.

In certain embodiments, the von Neumann unbiasing analysis module 208 of the random number generator 200 may perform: generating the random bit by saving the Candidate_Bit when the Candidate_Bit is not to be discarded by the von Neumann unbiasing analysis module 208.

Once the random bit of current loop is generated here, the random bit counter may be incremented.

At query block 318, the random number generator 200 may check whether the current random bit counter equals the predetermined number of random bits of the random number to be generated. When the current random bit counter equals the predetermined number of random bits of the random number to be generated, the method 300 proceeds to block 320. Otherwise, the method 300 loops back to block 304 to generate next random bit, until the last random bit of the random number is generated.

At block 320, the random number generator 200 may transmit the random number generated back to the requester through the input/output interface module 202.

In yet another aspect, the present disclosure relates to a computer program product operable on a CPU of a computer. In certain embodiments, the computer program product may include a non-transitory computer readable storage medium storing computer executable instructions. When these computer executable instructions are executed by the CPU, these computer executable instructions cause the CPU to perform: receiving, at an input/output interface module 202 of the random number generator 200, a request to generate a random number having a predetermined number of random bits, and initiating a random bit generating loop to generate each random bit of the random number to be generated. The random bit generating loop may include: incorporating a CPU_Time as a randomness factor in generating random number to improve entropy quality of the random number generator 200, generating a Candidate_Bit by using a Clock_Time, and generating a random bit for the random number by using a von Neumann unbiasing analysis module 208, until every random bit of the random number is generated.

In certain embodiments, the incorporating may include: retrieving, using a CPU_Time extraction module 204 of the random number generator 200, a CPU_Time from a CPU clock 210 of a CPU of a computer, performing, using the CPU_Time extraction module 204 of the random number generator 200, a modulo function to the CPU_Time, and purging level 1 (L1) cache of the CPU when the result of the modulo function is zero. The purging may include: explicitly purging the L1 cache entry where Time_Value is stored, and setting the Time_Value on the next instruction causing the cache entry to be filled again.

In certain embodiments, the generating Candidate_Bit may include: retrieving, using a Clock-Time extraction module of the random number generator 200, a Clock_Time from the CPU clock 210, and updating a Time_Value, calculating a Time_Delta by subtracting previous iteration Clock_Time from current Clock_Time retrieved, and creating a Fold_Counter and generating Candidate_Bit by using the Time_Delta calculated. The generating may include: retrieving, using the Clock-Time extraction module of the random number generator 200, another Clock_Time from the CPU clock 210, saving, low four bits of the time value, as the Fold_Counter, and looping Fold_Counter number of time for setting Candidate_Bit to Candidate_Bit XORed with low-order bit of Time_Delta, and bit shifting Time_Delta to the right one bit.

In certain embodiments, the generating random bit may include: performing, using a von Neumann unbiasing analysis module 208, a von Neumann unbiasing analysis to generate a random bit, checking whether the random bit generated is the last bit of the random number to be generated, returning to the beginning of the random bit generating loop to generate the next random bit until the last bit of the random number to be generated is generated when the random bit generated is not the last bit of the random number to be generated, and ending the random bit generating loop and transmitting the random number generated using the input/output interface module 202 when the random bit generated is the last bit of the random number to be generated. The performing a von Neumann unbiasing analysis to generate a random bit may include: generating the random bit by saving the Candidate_Bit when the Candidate_Bit is not to be discarded by the von Neumann unbiasing analysis module 208.

Aspects of the present disclosure are described herein with reference to flowchart illustrations and/or block diagrams of methods. It will be understood that each block of the flowchart illustrations and/or block diagrams, and combinations of blocks in the flowchart illustrations and/or block diagrams, can be implemented by computer readable program instructions or hardware.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A random number generator comprising:
   an input/output interface module configured to receive, from a requester, a request to generate a random number having a plurality of random bits, initiate a random bit generating loop to generate each of the plurality of random bits, and transmit the random number generated to the requester;
   a clock time extraction module configured to extract a clock time from a central processing unit (CPU) clock;
   a jitter collection module configured to accumulate non-predictable time differences by observing a latency of multiple operations and inducing a cache-related non-determinism by purging a CPU cache; and
   a von Neumann unbiasing analysis module configured to perform a von Neumann unbiasing analysis and to generate the plurality of random bits for the random number.

2. The random number generator of claim 1, wherein the clock time comprises a real time clock of the CPU for measuring elapsed real time.

3. The random number generator of claim 1, wherein the CPU time comprises an accumulator for measuring how busy the CPU is.

4. The random number generator of claim 1, wherein the CPU time extraction module of the random number generator is configured to improve entropy quality of the random number generator by performing:
   retrieving a CPU time from the CPU clock of the CPU;
   performing a modulo function to the CPU time; and
   purging a level 1 (L1) cache of the CPU when a result of the modulo function is zero.

5. The random number generator of claim 1, wherein the clock time extraction module of the random number generator is configured to improve entropy quality of the random number generator by performing:
   retrieving a clock time from the CPU clock, and updating a time value;
   calculating a time delta by subtracting a previous iteration clock time from a current clock time retrieved; and
   creating a fold counter and generating a candidate bit by using the time delta calculated.

6. The random number generator of claim 5, wherein the clock time extraction module of the random number generator is further configured to perform:
   saving low four bits of the time value as the fold counter; and
   looping a fold counter number of times, wherein the looping comprises:
     setting the candidate bit to the candidate bit XORed with a low-order bit of the time delta; and
     bit shifting the time delta to the right one bit, until the loop ends.

7. The random number generator of claim 6, wherein the von Neumann unbiasing analysis module of the random number generator is configured to perform:
   generating the random bit by saving the candidate bit when the candidate bit is not to be discarded by the von Neumann unbiasing analysis module.

8. A method of injecting central processing unit (CPU) time jitter to improve entropy quality of a random number generator, comprising:
   receiving, at an input/output interface module of the random number generator, a request to generate a random number, wherein the requested random number comprises a plurality of random bits; and
   initiating a random bit generating loop to generate each of the plurality of random bits of the random number to be generated, wherein the random bit generating loop comprises:
     generating a candidate bit by using a clock time; and generating a random bit for the random number by using a von Neumann unbiasing analysis module, until every random bit of the random number is generated.

9. The method of claim 8, further comprising incorporating a CPU time as a randomness factor in generating the random number to improve entropy quality of the random number generator; wherein the incorporating comprises:
retrieving, using a CPU time extraction module of the random number generator, a CPU time from a CPU clock of a CPU of a computer;
performing, using the CPU time extraction module of the random number generator, a modulo function to the CPU Time; and
purging a level 1 (L1) cache of the CPU when a result of the modulo function is zero.

10. The method of claim 9, wherein the purging comprises:
explicitly purging a L1 cache entry where time value is stored; and
setting the time value on a next instruction causing the cache entry to be filled again.

11. The method of claim 9, wherein the generating the candidate bit comprises:
retrieving, using a clock time extraction module of the random number generator, a clock time from the CPU clock, and updating a time value;
calculating a time delta by subtracting a previous iteration clock time from a current clock time retrieved; and
creating a fold counter and generating the candidate bit by using the time delta calculated.

12. The method of claim 11, wherein the generating comprises:
retrieving, using the clock time extraction module of the random number generator, another clock time from the CPU clock;
saving low four bits of the time value as the fold counter; and
looping a fold counter number of times, wherein the looping comprises:
setting the candidate bit to the candidate bit XORed with a low-order bit of the time delta; and
bit shifting the time delta to the right one bit.

13. The method of claim 11, wherein the generating the random bit comprises:
performing, using a von Neumann unbiasing analysis module, a von Neumann unbiasing analysis to generate a random bit;
checking whether the random bit generated is the last bit of the random number to be generated;
returning to a beginning of the random bit generating loop to generate the next random bit until the last bit of the random number to be generated is generated when the random bit generated is not the last bit of the random number to be generated; and
ending the random bit generating loop and transmitting the random number generated using the input/output interface module when the random bit generated is the last bit of the random number to be generated.

14. The method of claim 13, wherein the performing a von Neumann unbiasing analysis to generate a random bit comprises:
generating the random bit by saving the candidate bit when the candidate bit is not to be discarded by the von Neumann unbiasing analysis module.

15. A computer program product operable on a central processing unit (CPU) of a computer comprising a non-transitory computer readable storage medium having computer executable instructions embodied therewith, wherein when executed by the CPU, the computer executable instructions cause the CPU to perform:
receiving, at an input/output interface module of a random number generator, a request to generate a random number, wherein the requested random number comprises a plurality of random bits; and
initiating a random bit generating loop to generate each of the plurality of random bits of the random number to be generated, wherein the random bit generating loop comprises:
generating a candidate bit by using a clock time; and
generating a random bit for the random number by using a von Neumann unbiasing analysis module, until every random bit of the random number is generated.

16. The computer program product of claim 15, wherein the computer executable instructions cause the CPU to perform incorporating a CPU time as a randomness factor in generating random number to improve entropy quality of the random number generator, wherein the incorporating comprises:
retrieving, using a CPU time extraction module of the random number generator, a CPU time from a CPU clock of a CPU of a computer;
performing, using the CPU time extraction module of the random number generator, a modulo function to the CPU time; and
purging a level 1 (L1) cache of the CPU when a result of the modulo function is zero,
wherein the purging comprises:
explicitly purging a L1 cache entry where the time value is stored; and
setting the time value on the next instruction causing the cache entry to be filled again.

17. The computer program product of claim 16, wherein the generating the candidate bit comprises:
retrieving, using a clock time extraction module of the random number generator, a clock time from the CPU clock, and updating a time value;
calculating a time delta by subtracting a previous iteration clock time from a current clock time retrieved; and
creating a fold counter and generating the candidate bit by using the time delta calculated.

18. The computer program product of claim 17, wherein the creating comprises:
retrieving another clock time from the CPU clock;
saving low four bits of the time value, as the fold counter; and
looping a fold counter number of times; wherein the looping comprises:
setting the candidate bit to the candidate bit XORed with a low-order bit of the time delta; and
bit shifting the time delta to the right one bit.

19. The computer program product of claim 17, wherein the generating random bit comprises:
performing, using a von Neumann unbiasing analysis module, a von Neumann unbiasing analysis to generate a random bit;
checking whether the random bit generated is the last bit of the random number to be generated;
returning to a beginning of the random bit generating loop to generate the next random bit until the last bit of the random number to be generated is generated when the random bit generated is not the last bit of the random number to be generated; and ending the random bit generating loop and transmitting the random number generated using the input/output interface module when the random bit generated is the last bit of the random number to be generated.

20. The computer program product of claim 19, wherein the performing a von Neumann unbiasing analysis to generate a random bit comprises:
  generating the random bit by saving the candidate bit when the candidate bit is not to be discarded by the von Neumann unbiasing analysis module.

* * * * *